(12) United States Patent
Clark et al.

(10) Patent No.: US 11,449,302 B2
(45) Date of Patent: Sep. 20, 2022

(54) VOLUME ADJUSTMENTS BASED ON AMBIENT SOUNDS AND VOICES

(71) Applicant: Hewlett-Packard Development Company, L.P., Spring, TX (US)

(72) Inventors: Alexander Wayne Clark, Spring, TX (US); Kent E. Biggs, Spring, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/054,652

(22) PCT Filed: Sep. 28, 2018

(86) PCT No.: PCT/US2018/053512
§ 371 (c)(1),
(2) Date: Nov. 11, 2020

(87) PCT Pub. No.: WO2020/068126
PCT Pub. Date: Apr. 2, 2020

(65) Prior Publication Data
US 2021/0216269 A1   Jul. 15, 2021

(51) Int. Cl.
*H03G 3/32*   (2006.01)
*G06F 3/16*   (2006.01)
(Continued)

(52) U.S. Cl.
CPC ............. *G06F 3/165* (2013.01); *G10L 25/51* (2013.01); *G10L 25/78* (2013.01); *H03G 3/32* (2013.01); *H04R 1/08* (2013.01); *H04R 1/1041* (2013.01); *H04R 1/1075* (2013.01); *H04R 1/1083* (2013.01); *H04R 1/406* (2013.01); *H04R 3/005* (2013.01); *H04R 29/001* (2013.01); *H04R 2430/01* (2013.01)

(58) Field of Classification Search
CPC ..... G10K 11/17827; G10K 2210/1081; H03G 3/32; H03G 5/165; H04R 1/1041; H04R 1/1075; H04R 1/1083; H04R 1/406; H04R 3/005
USPC ...................... 381/56–57, 74, 104–109, 71.6
See application file for complete search history.

(56) References Cited

U.S. PATENT DOCUMENTS 6,782,106 B1    8/2004  Kong et al.
7,706,821 B2 *  4/2010  Konchitsky ......... H04M 1/6066
                                              455/114.2

(Continued)

FOREIGN PATENT DOCUMENTS

CN    103973863 A    8/2014
CN    106210236 A    12/2016

(Continued)

*Primary Examiner* — Disler Paul
(74) *Attorney, Agent, or Firm* — Perry + Currier Inc.

(57) ABSTRACT

An example device includes a headset interface to connect a headset that includes a speaker and a first microphone, a second microphone to detect ambient sound in an environment of the device, and a processor connected to the headset interface and the second microphone. The processor is to perform a volume adjustment to sound to be outputted at the speaker of the headset based on the ambient sound detected by the second microphone during a call that uses the headset. The processor is further to compensate the volume adjustment for a user's voice detected at the first microphone.

12 Claims, 7 Drawing Sheets

(51) Int. Cl.
*G10L 25/51* (2013.01)
*G10L 25/78* (2013.01)
*H04R 1/08* (2006.01)
*H04R 1/10* (2006.01)
*H04R 1/40* (2006.01)
*H04R 3/00* (2006.01)
*H04R 29/00* (2006.01)

(56) References Cited

U.S. PATENT DOCUMENTS

| | | | |
|---|---|---|---|
| 7,968,786 B2 | 6/2011 | Kemmochi et al. | |
| 8,340,323 B2 | 12/2012 | Asada et al. | |
| 9,142,205 B2 | 9/2015 | Alderson et al. | |
| 9,232,035 B2 | 1/2016 | Cho et al. | |
| 10,469,936 B2* | 11/2019 | Ozluturk | G06F 3/165 |
| 2015/0104041 A1* | 4/2015 | Kulavik | H04R 1/1041 |
| | | | 381/107 |
| 2015/0243272 A1* | 8/2015 | Ozluturk | G10K 11/17827 |
| | | | 381/71.6 |
| 2015/0243296 A1 | 8/2015 | Purpura | |
| 2016/0330546 A1* | 11/2016 | Barrentine | G10K 11/17857 |
| 2018/0033428 A1* | 2/2018 | Kim | G10L 15/22 |
| 2018/0167718 A1 | 6/2018 | Cha et al. | |

FOREIGN PATENT DOCUMENTS

| | | |
|---|---|---|
| JP | 04123598 A | 4/1992 |
| JP | 04278796 A | 10/1992 |
| JP | 2897316 B2 | 5/1999 |
| JP | 2005-086284 A | 3/2005 |
| JP | 2007043231 A | 2/2007 |
| JP | 2007088521 A | 4/2007 |
| JP | 5849435 B2 | 1/2016 |
| WO | WO-2007007916 A1 | 1/2007 |
| WO | WO-2013102228 A1 | 7/2013 |
| WO | 2018/059030 A1 | 4/2018 |

\* cited by examiner

VOLUME ADJUSTMENTS BASED ON AMBIENT SOUNDS AND VOICES

BACKGROUND

Electronic devices are used for voice communications among users. It is often the case that a user will wear a headset when participating in the call, so as to free his/her hands to take notes or undertake other activities.

DETAILED DESCRIPTION

A person using a headset to communicate may not be aware that others in the vicinity may be able to hear output of the headset's speaker. This sound leakage may annoy other people or may inadvertently disclose sensitive information, as the voice of the remote party to a call may be audible to others.

During a call, a headset volume is adjusted based on ambient sound. This includes adjusting headset volume based on sound leakage from the headset. Headset volume may be reduced when sound leakage is detected, so as to reduce annoyance to nearby people or to reduce the risk of inadvertently disseminating sensitive information through the headset speaker. Sound leakage may be inferred instead of being detected. The adjustment of headset speaker volume is compensated for a local user's voice present in the ambient sound. That is, as the local user participates in the call, the local user's voice is considered when adjusting headset volume based on ambient sound in the environment around the local user.

Figure 1:
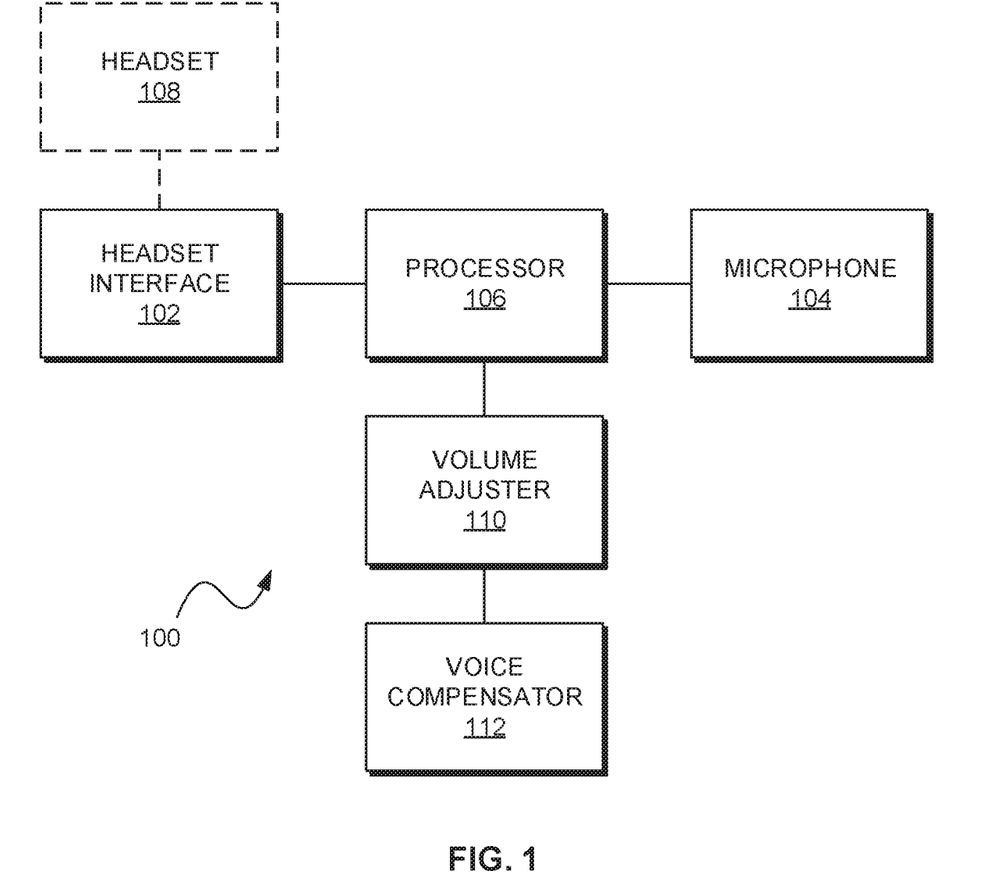
FIG. 1 is a block diagram of an example device to compensate a volume adjustment for a user's voice during a call.

FIG. 1 shows an example device 100. The device 100 may be a notebook computer, a desktop computer, a smartphone, a tablet computer, or similar device capable of digital communications.

The device 100 includes a headset interface 102, a microphone 104, and a processor 106 connected to the headset interface 102 and the microphone 104.

The headset interface 102 receives the connection of a headset 108 that may include a speaker and headset microphone or first microphone. The headset interface 102 may provide a physical connection, such as a Universal Serial Bus (USB™) port, a 3.5 mm audio jack, or similar. The headset interface 102 may provide a wireless connection, such as Bluetooth™ connectivity, Institute of Electrical and Electronics Engineers (IEEE) 802.11 (Wi-Fi) connectivity, or similar. The headset interface 102 is to facilitate voice communications between a user of the device 100 and another user of another device. Examples of voice communications include a telephone call, a Voice over Internet Protocol (VoIP) call, a call using an application or service such as Skype™, Google Hangouts™, Facebook Messenger™ Apple FaceTime™, and similar applications and services.

The microphone 104 or second microphone is to detect ambient sound in an environment of the device 100. The microphone 104 may be a permanent component of the device 100 and may be located within the housing of the device 100.

When a headset 108 is connected to the device 100 for use during a call, the microphone 104 is distant from the headset's microphone, such that the two microphones capture different sound. The headset microphone is to facilitate the call and the second microphone 104 is to capture ambient sound, so that automatic volume adjustment may be made for the headset. Sound input to these microphones may overlap. Specifically, the second microphone 104 may capture, or "overhear", a user's voice as he/she speaks into the headset's microphone. The processor 106 is to compensate for the presence of the user's voice in captured ambient sound, so that the automatic volume adjustment may be performed accurately.

The processor 106 may include a digital signal processor (DSP), central processing unit (CPU), a microcontroller, a microprocessor, a processing core, a field-programmable gate array (FPGA), or a similar device capable of executing instructions. The processor 106 may cooperate with a non-transitory machine-readable medium that may be an electronic, magnetic, optical, or other physical storage device that encodes executable instructions. The machine-readable medium may include, for example, random access memory (RAM), read-only memory (ROM), electrically-erasable programmable read-only memory (EEPROM), flash memory, a storage drive, an optical disc, or similar.

The processor 106 performs a volume adjustment to sound to be outputted at the speaker of the headset 108 based on sound detected by the second microphone 104 during a call that uses the headset 108. The processor 106 may execute a volume adjuster 110, which may be formed of processor-executable instructions, to provide volume adjustment.

The volume adjustment may include decreasing the volume of the headset speaker when sound outputted by the speaker is appreciably detected in sound captured by the microphone 104. Accordingly, sound leakage from the headset 108 is reduced or eliminated, so as to avoid annoying nearby people and avoid disseminating potentially sensitive information provided by the remote side of a call. The volume adjustment may further include maintaining or increasing the volume of the headset speaker when sound outputted by the speaker is not appreciably detected in sound captured by the microphone 104.

Another example of volume adjustment includes decreasing headset speaker volume when ambient sound decreases. Headset speaker volume may be increased when ambient sound increases. Hence, rather than detecting speaker leakage in ambient sound, this method makes a simplifying assumption as to the degree of leakage may be perceptible to nearby users based on measured ambient sound.

The processor 106 further compensates the volume adjustment for the user's voice detected at the headset 108. The processor 106 may execute a voice compensator 112, which may be formed of processor-executable instructions, to provide voice compensation.

Voice compensation reduces the effect of the user's voice captured by the microphone 104 that is intended to capture ambient sound. The sound information captured by the microphone 104 may be made independent to the user's voice, so that an accurate volume adjustment may be made. That is, the user's voice, which may obscure or confound ambient sound level measurement or leakage detection, is reduced or removed from consideration when determining whether the volume of the headset speaker should be raised or lowered.

Figure 2:
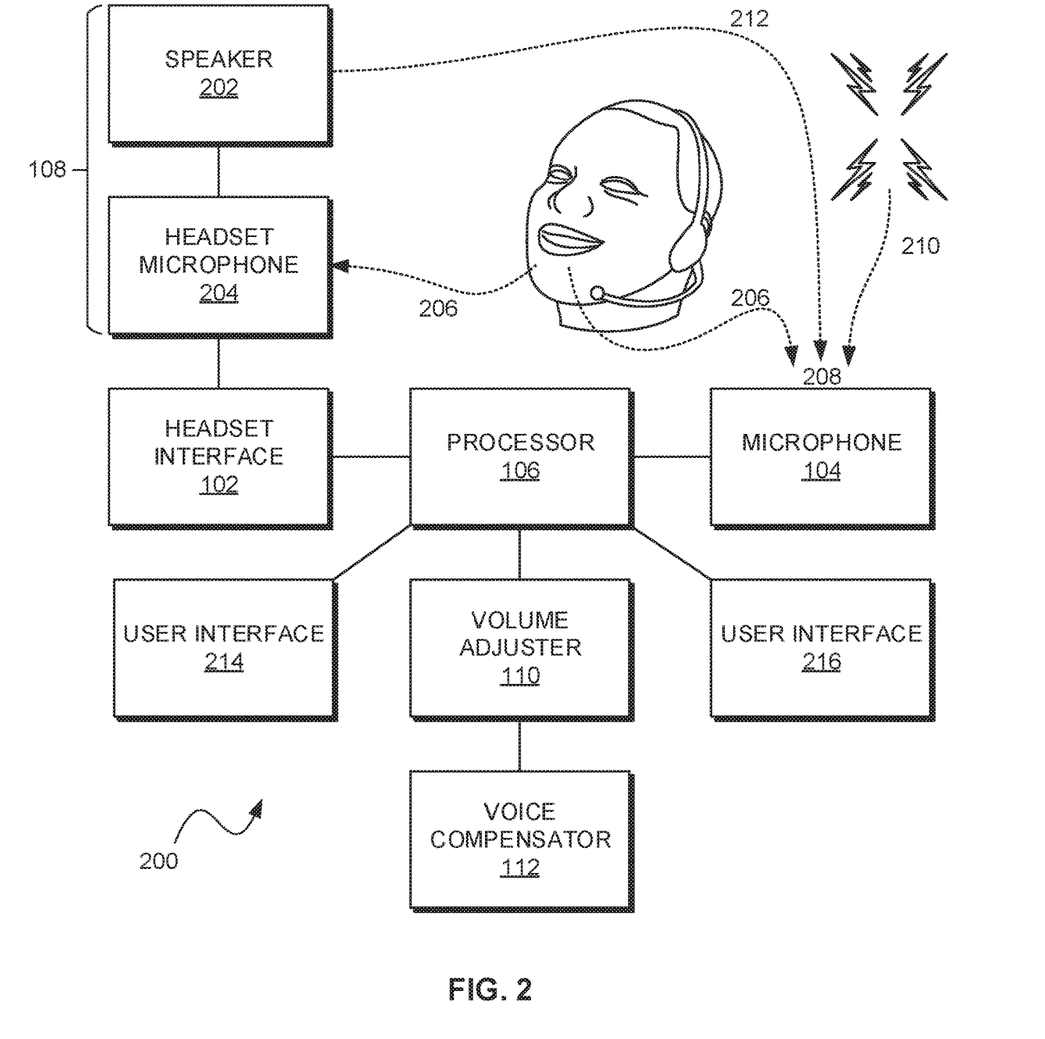
FIG. 2 is a block diagram of an example device to compensate a volume adjustment for a user's voice during a call with a headset.

FIG. 2 shows an example device 200 with a headset 108 connected. Features and aspects of the other devices described herein may be used with the device 200 and vice versa Like reference numerals denote like elements and description of like elements is not repeated here.

Examples of headsets include over-ear headsets/headphones, in-ear headsets/headphones, on-ear headsets/headphones, earbuds, and similar. The headset may allow for wired or wireless connection to the device 200. The headset includes a speaker 202 and a headset microphone 204, which may be positioned on an arm extending from the speaker, positioned on a wire connecting the headset to the device 200, or positioned at another location at or near the headset 108. In other examples, the microphone 204 is separate from the headset 108.

During a call, the headset microphone 204 captures the user's voice 206 and a separate microphone 104 captures sound 208 in the user's environment. The captured environmental sound 208 may include components from the user's voice 206, ambient sound 210, and sound leakage 212 from the speaker 202 of the headset 108.

As discussed above, a voice compensator 112 may compensate for the user's voice 206 captured by the microphone 104, so that a volume adjuster 110 may control sound leakage from the speaker 202 with reduced or eliminated influence of the user's own voice 206.

The device 200 may further include a network interface 214 to connect the device 200 with a network that may be used to facilitate calls between a local user of the device 200 and a remote user of another device. The network interface 214 may be connected to the processor 106 to provide data communications with a wide-area IP network, such as the internet.

The device 200 may further include a user interface 216 connected to the processor 106. The user interface 216 may include a keyboard, mouse, trackpad, screen, touchscreen, or similar component. When the volume adjuster 110 is to adjust the volume of the headset speaker 202, the device 200 may trigger the user interface 216 indicate to the user that the volume will be adjusted or to request permission from the user to adjust the volume. For example, the processor 106 may initiate a pop-up window to be displayed to the user with text, such as "People nearby may be able to hear your headphones. Press OK to automatically reduce headphone volume," in conjunction with buttons to accept and deny the request. As such, the processor 106 and user interface 216 may be used to receive user confirmation of a recommended volume adjustment.

Figure 3:
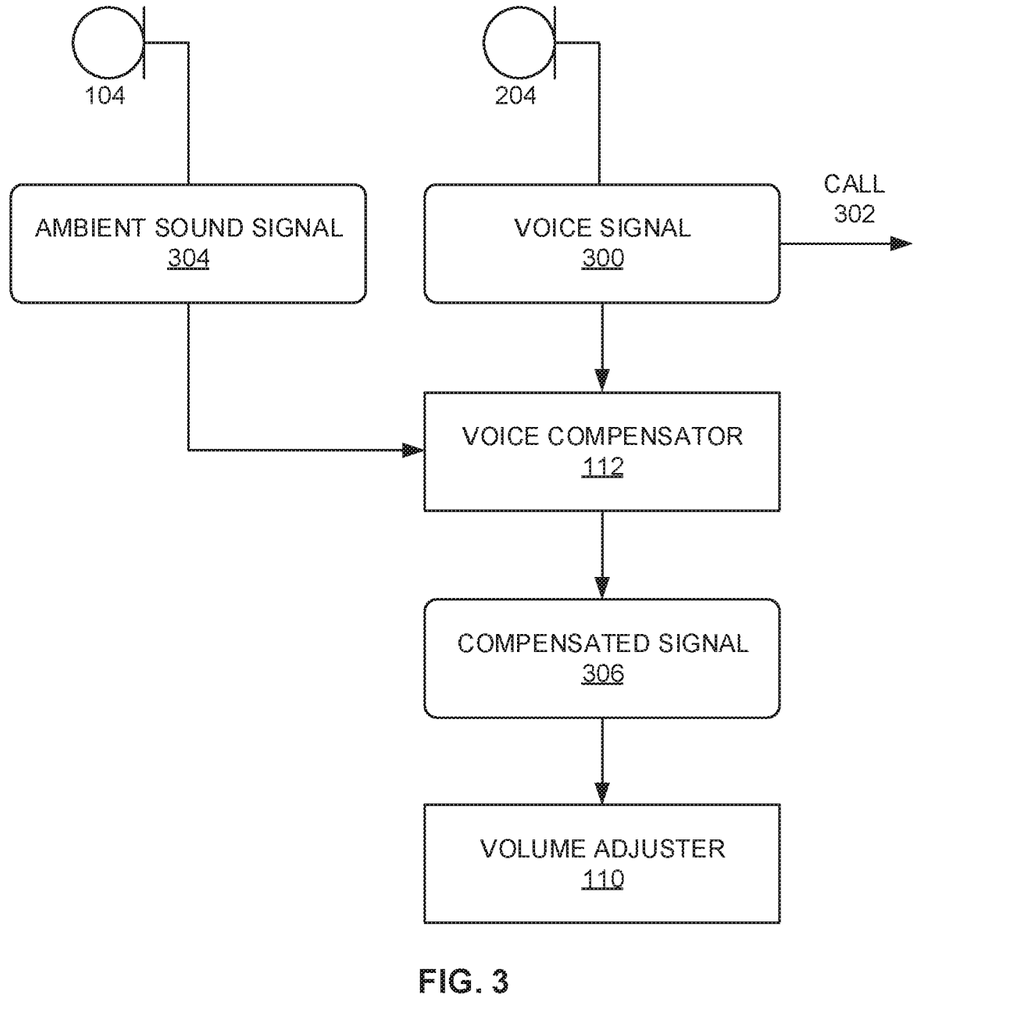
FIG. 3 is a schematic diagram of an example voice compensator and an example volume adjuster to adjust a headset volume during a call.

As shown in FIG. 3, a voice signal 300 of the user's voice is captured by the headset microphone 204 for use by a call 302. The voice compensator 112 may use the voice signal 300 to remove a trace of the user's voice from an ambient sound signal 304 captured by the second microphone 104 to obtain a compensated signal 306. The volume adjuster 110 may then perform a volume adjustment with the compensated signal 306.

Figure 4:
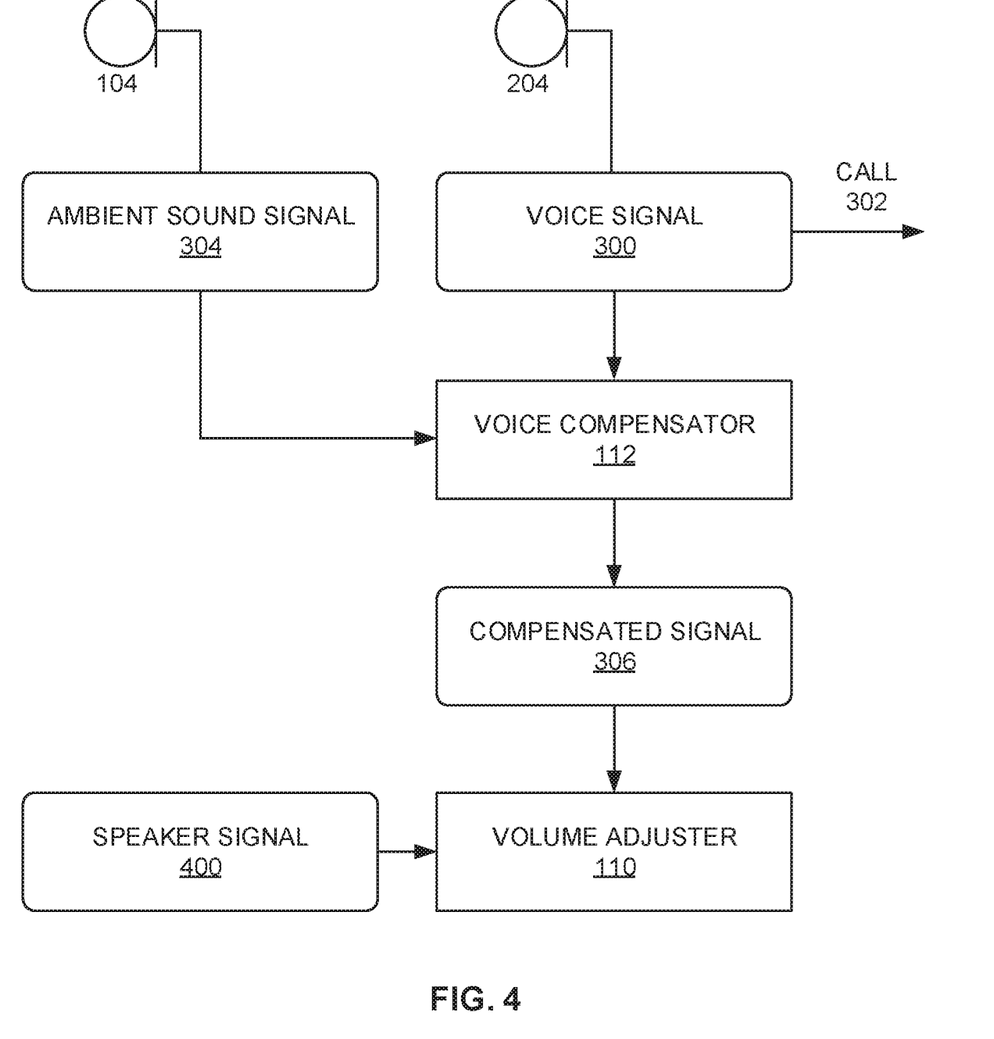
FIG. 4 is a schematic diagram of an example voice compensator and an example volume adjuster to reference a headset speaker signal to adjust a headset volume during a call.

As shown in FIG. 4, the volume adjuster 110 may reference a speaker signal 400 destined for output at the headset to perform a volume adjustment for the headset. The speaker signal 400 may include a representation of a remote user's voice. The volume adjustment may include decreasing a volume of the headset speaker in response to detecting sound leakage from the headset speaker with the ambient microphone 104. For example, the volume adjuster 110 may detect a trace of a remote user's voice or other sound leakage from the headset in the compensated signal 306 and then decrease the headset speaker's volume. Detection of sound leakage may include identifying a trace of the speaker signal 400 in the compensated signal 306. A suitable signal correlation technique may be used to determine whether or not, or the extent to which, the speaker signal 400 exists in the compensated signal 306.

In another example, the volume adjuster 110 does not reference the speaker signal 400 and the volume adjuster 110 may decrease the headset speaker's volume when a level of the compensated signal 306 is below a threshold level. That is, if the compensated ambient sound is low enough, then the headset volume is decreased without determining whether there is actual sound leakage.

Figure 5:
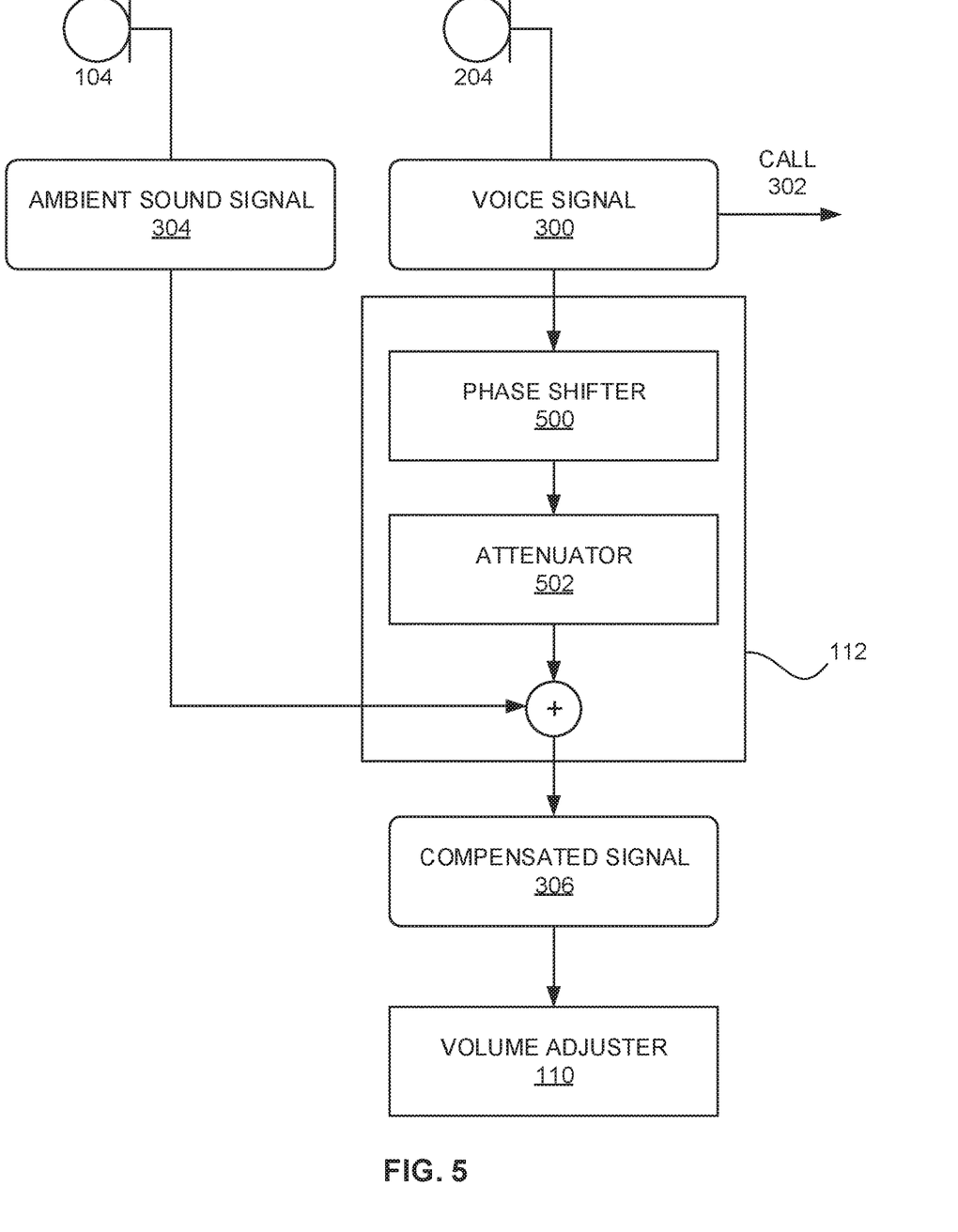
FIG. 5 is a schematic diagram of an example voice compensator that uses phase shifting to compensate a volume adjustment for a user's voice during a call with a headset.

As shown in FIG. 5, an example voice compensator 112 may include a phase shifter 500 and an attenuator 502. The phase shifter 500 may phase shift the voice signal 300 by 180 degrees and the attenuator 502 may reduce the amplitude of the voice signal 300 to a level that approximates the ambient sound signal 304. The resulting phase-shifted and attenuated voice signal is added to the ambient sound signal 304 to obtain the compensated signal 306. As such, the voice compensator 112 uses an inverted and scaled version of the voice signal to remove the user's voice from the ambient sound signal 304. The volume adjuster 110 may then perform a volume adjustment with the compensated signal 306.

Figure 6:
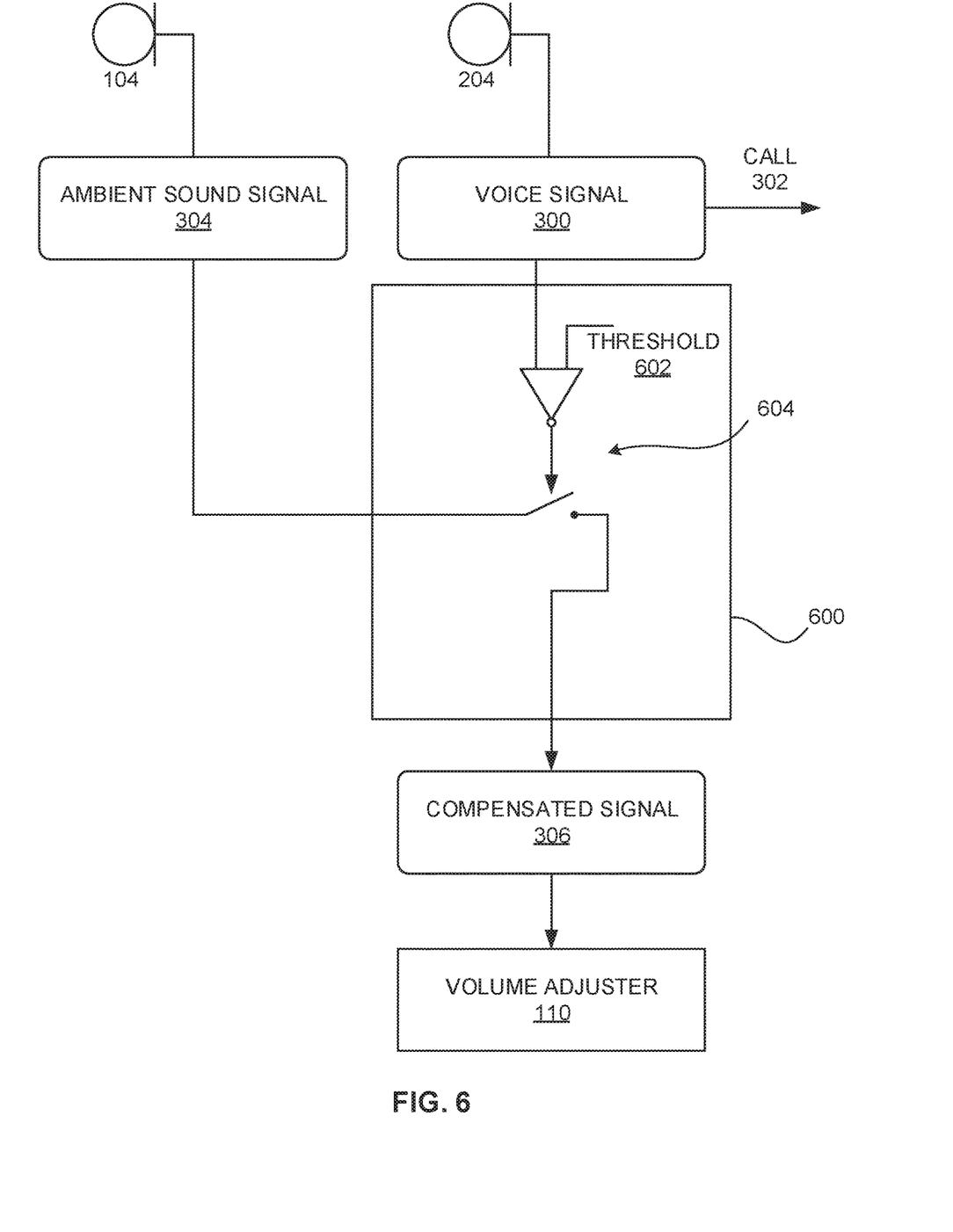
FIG. 6 is a schematic diagram of an example voice compensator that using voice detection to compensate a volume adjustment for a user's voice during a call with a headset.

As shown in FIG. 6, another example voice compensator 600 may control a time of detection of ambient sound with the second microphone 104 based on a voice signal 300 of the local user's voice detected by the headset microphone 204. That is, the voice signal 300 may be used to determine when the ambient sound signal 304 is to be captured. This may be achieved by a comparing a level of the voice signal 300 to a threshold level 602 and causing the volume adjuster 110 to operate on the ambient sound signal 304 when the level of the voice signal 300 does not exceed the threshold level 602, as indicated schematically at 604. For example, when the voice signal 300 is below a threshold level, captured ambient sound is used to determine speaker leakage by the volume adjuster 110. That is, it is determined that the local user's voice is not present or will not confound the ambient sound measurement. When the voice signal 300 is above the threshold level, ambient sound is not captured or, if captured, the volume adjuster 110 does not operate on it to control volume. That is, it is determined that the local user's voice is present and may confound the ambient sound measurement. As such, a trace of the local user's voice in the ambient sound signal 304 may be compensated by selectively capturing ambient sound signal 304 at times when the local user's voice is not expected to be present in the ambient sound signal 304.

Figure 7:
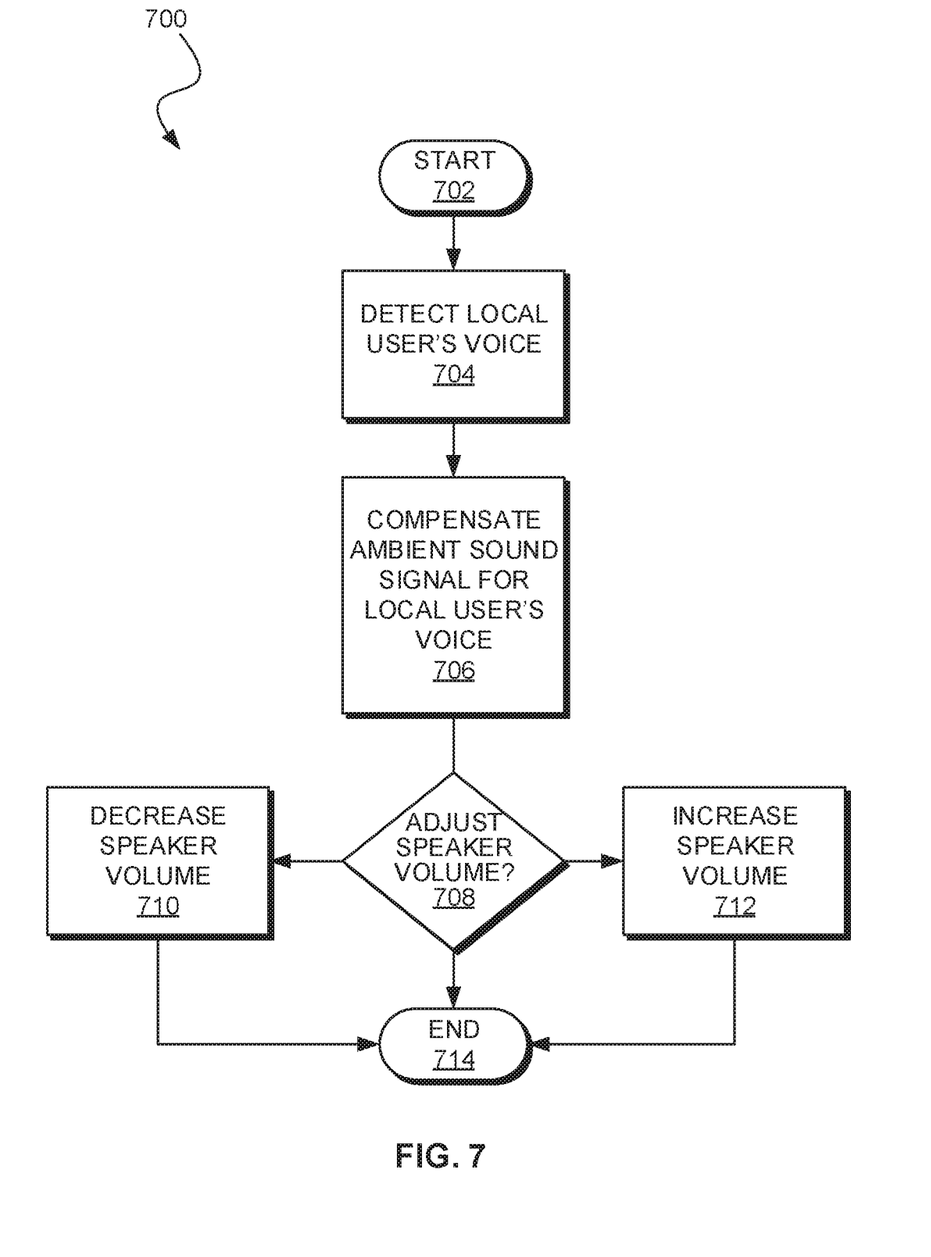
FIG. 7 is a flowchart of an example method to compensate a volume adjustment for a user's voice during a call.

FIG. 7 shows an example method 700 to compensate for a local user's voice when detecting ambient sound for automatic volume adjustment. The method 700 may be implemented with any of the devices described herein. The method 700 may be implemented as processor-executable instructions. The method starts at block 702.

At block 704, a local user's voice is detected at a local device during a call between the local device and a remote device. The local user uses a headset to communicate. The headset includes a speaker and a microphone for the call. The local device also includes an ambient sound microphone to facilitate automatic volume adjustment of speaker output at the headset to avoid annoying nearby people or to reduce a risk that sensitive information will be inadvertently disclosed.

At block 706, an ambient sound signal at the local device is compensated for the local user's voice. For example, a trace of the local user's voice may be removed from a captured ambient sound signal. In another example, the ambient sound signal is captured when the local user's voice is below a threshold level.

At block 708, it is determined whether headset output volume is to be decreased, increased, or allowed to remain the same. In some examples, such automatic volume control may be limited to decreasing headset output volume, with increasing headset volume being subject to manual control.

In some examples, headset output volume may be decreased, at block 710, if a trace of the headset speaker output is detected in the ambient sound signal. That is, if the ambient sound microphone picks up the headset output, then the headset volume is decreased. In other examples, such detection is not conducted, and it may be assumed that, if the ambient sound signal is below a certain level, then sound leakage may be occurring and headset volume should be decreased.

At block 712, headset speaker volume may be increased when sound leakage is determined to not occur. In some examples, headset output volume may be increased if a trace of the headset speaker output is not detected in the ambient sound signal. In other examples, such detection is not conducted, and it may be assumed that, if the ambient sound signal is above a certain level, then sound leakage does not occur and headset volume may be increased.

The method 700 ends at block 714 and may be continually repeated for the duration of a call.

In view of the above, it should be apparent that automatic headset volume adjustment may be performed during a call in a manner that considers a local user's voice. Ambient sound that is used to perform headset volume adjustment may be conditioned or selectively captured to reduce the effect of the local user's voice.

It should be recognized that features and aspects of the various examples provided above can be combined into further examples that also fall within the scope of the present disclosure. In addition, the figures are not to scale and may have size and shape exaggerated for illustrative purposes.

The invention claimed is:

1. A device comprising:
a headset interface to connect a headset that includes a speaker and a first microphone;
a second microphone to detect ambient sound in an environment of the device; and
a processor connected to the headset interface and the second microphone, the processor to perform a volume adjustment to sound to be outputted at the speaker of the headset based on the ambient sound detected by the second microphone during a call that uses the headset, the processor further to compensate the volume adjustment for a user's voice detected at the first microphone; wherein the processor is further to remove a trace of the user's voice captured by the first microphone from an ambient sound signal captured by the second microphone.

2. The device of claim 1, wherein the processor is to perform the volume adjustment on a compensated signal obtained by removal of the trace of the user's voice from the ambient sound signal.

3. The device of claim 1, wherein the processor is to control a time of detection of the ambient sound with the second microphone based on a voice signal of the user's voice detected by the first microphone.

4. The device of claim 1, wherein the volume adjustment includes decreasing a volume of the speaker in response to detecting sound leakage from the speaker with second microphone.

5. A non-transitory machine-readable medium encoded with processor-executable instructions to perform a volume adjustment to sound to be outputted at a headset of a device based on ambient sound detected by an ambient sound microphone of the device during a call that uses the headset, the instructions further to compensate the volume adjustment for a user's voice detected at a headset microphone, wherein the instructions are further to remove the user's voice from an ambient sound signal captured by the ambient sound microphone.

6. The non-transitory machine-readable medium of claim 5, wherein the instructions are to perform the volume adjustment on a compensated signal obtained by removal of the user's voice from the ambient sound signal.

7. The non-transitory machine-readable medium of claim 5, wherein the instructions are to selectively capture the ambient sound with the ambient sound microphone based on a voice signal of the user's voice detected by the headset microphone.

8. The non-transitory machine-readable medium of claim 5, wherein the volume adjustment includes decreasing a volume of sound outputted by the headset in response to detecting or inferring sound leakage from the headset.

9. A device comprising:
a headset interface to connect a headset that includes a speaker and a headset microphone;
an additional microphone distant from the headset microphone to detect ambient sound in an environment of the device; and
a processor connected to the headset interface and the additional microphone, the processor to detect a user's voice at the headset microphone, the processor further to perform a volume adjustment to sound outputted by the speaker of the headset based on an ambient sound detected by the additional microphone and further based on the user's voice as detected by the headset microphone;
wherein the processor is to remove the user's voice from an ambient sound signal captured by the additional microphone to obtain a compensated signal, and wherein the processor is to reference the compensated signal to perform the volume adjustment.

10. The device of claim 9, wherein the processor is to reduce a volume of sound outputted by the speaker of the headset in response to detecting leakage of sound from the speaker in the compensated signal.

11. The device of claim 9, wherein the processor is to selectively capture the ambient sound with the additional microphone when a voice signal of the user's voice captured by the headset microphone does not exceed a threshold level.

12. The device of claim 9, further comprising a user interface connected to the processor, the processor and user interface to request a user confirmation of the volume adjustment.

\* \* \* \* \*